US006689287B2

(12) United States Patent
Schubring et al.

(10) Patent No.: US 6,689,287 B2
(45) Date of Patent: Feb. 10, 2004

(54) FERROELECTRIC AND FERROMAGNETIC MATERIAL HAVING IMPROVED IMPEDANCE MATCHING

(75) Inventors: Norman W. Schubring, Troy, MI (US); Joseph V. Mantese, Shelby Township, MI (US); Adolph L. Micheli, Harrison Township, MI (US)

(73) Assignee: Delphi Technologies, Inc., Troy, MI (US)

( * ) Notice: Subject to any disclaimer, the term of this patent is extended or adjusted under 35 U.S.C. 154(b) by 83 days.

(21) Appl. No.: 10/004,607

(22) Filed: Nov. 1, 2001

(65) Prior Publication Data

US 2003/0085375 A1 May 8, 2003

(51) Int. Cl.[7] ........................ H01L 41/187; H01L 41/18; H01L 41/20

(52) U.S. Cl. .......................... 252/62.9 R; 252/62.9 PZ; 252/62.55; 252/62.51 R; 252/62.51 C; 252/62.56; 252/62.57; 252/62.58; 252/62.59; 252/62.6; 252/62.61; 252/62.62; 252/62.63; 252/62.64

(58) Field of Search ..................... 252/62.9 R, 62.9 PZ, 252/62.51 R, 62.55, 62.56, 62.57, 62.58, 62.59, 62.6, 62.61, 62.62, 62.63, 62.64, 62.51 C

(56) References Cited

U.S. PATENT DOCUMENTS 5,497,129 A 3/1996 Mantese et al.
5,601,748 A * 2/1997 Mansour et al. ....... 252/62.9 R
5,856,770 A 1/1999 Mantese et al.
6,063,719 A 5/2000 Sengupta et al.
6,074,971 A 6/2000 Chiu et al.

* cited by examiner

*Primary Examiner*—C. Melissa Koslow
(74) *Attorney, Agent, or Firm*—Scott A. McBain

(57) ABSTRACT

The subject invention includes a composite material comprising a ferroelectric material and a ferromagnetic material having a loss factor (tan δ) for the composite material which includes a dielectric loss factor of the ferroelectric material and a magnetic loss factor of the ferromagnetic material. The composite material achieves the loss factor of from 0 to about 1.0 for a predetermined frequency range greater than 1 MHz. The ferroelectric material has a dielectric loss factor of from 0 to about 0.5 and the ferromagnetic material has a magnetic loss factor of from 0 to about 0.5 for the predetermined frequency range. The ferroelectric material is present in an amount from 10 to 90 parts by volume based on 100 parts by volume of the composite material and the ferromagnetic material is present in an amount from 10 to 90 parts by volume based upon 100 parts by volume of the composite material such that the amount of the ferroelectric material and the ferromagnetic material equals 100 parts by volume.

31 Claims, 3 Drawing Sheets

FERROELECTRIC AND FERROMAGNETIC MATERIAL HAVING IMPROVED IMPEDANCE MATCHING

FIELD OF THE INVENTION

The present invention relates generally to composite materials, and more specifically, to a composite material comprising a ferroelectric material and a ferromagnetic material having improved impedance matching.

BACKGROUND OF THE INVENTION

Various composite materials are produced comprising a ferroelectric material and a ferromagnetic material. Typically, these composite materials have been designed to dissipate electromagnetic radiation as the electromagnetic radiation passes through the composite material. U.S. Pat. Nos. 5,856,770; 5,601,748; and 5,497,129; each disclose a composite material comprising a ferroelectric material and a ferromagnetic material for dissipating electromagnetic radiation.

These prior art references select the ferroelectric material and ferromagnetic material such that the composite material has a high filtering capability for suppressing electromagnetic interference (EMI). This is accomplished by selecting the ferroelectric material having a favorable dielectric constant ($\in$) and the ferromagnetic material having a favorable permeability ($\mu$). The composite material is then formed by tailoring the amounts of the materials to achieve a $\mu/\in$ ratio for the composite material which will dissipate (or reflect) incident electromagnetic radiation in order to reduce electromagnetic interference. In such applications, a high dissipation factor is desired. These composite materials exhibits a loss factor which increases above 1 MHz and therefore the composite material is used to filter EMI at frequencies above 1 MHz. These composite materials disclosed in these patents are not capable of storing, focusing, shaping, or transmitting the electromagnetic radiation without significant energy loss in the material.

However, in applications where the electromagnetic radiation has to be launched into the active material through proper impedance matching with the incident medium, a high dissipation factor is not desirable. It is well known that the velocity of the electromagnetic radiation through a medium is dictated by the square root of the product of $\mu$ (permeability) and $\in$ (permittivity). The greater the value of the product, the slower is the velocity of propagation of the wave through the medium. Moreover, the closer the ratio of $\mu$ to $\in$ is to unity, the better the impedance matching of the circuit is to the impedance of air.

Another composite material, as disclosed in U.S. Pat. Nos. 6,074,971 and 6,063,719, is utilized for impedance matching. The composite material includes a ferroelectric material doped with a magnesium compound. The composite material exhibits a dielectric loss of less than 0.01 at 250 KHz by optimizing the dielectric properties of the composite material at the selected frequency. However, the composite material is formed to exhibit the loss factor at the selected frequency and not over a predetermined frequency range. As the frequency is increased, the dielectric loss of the composite material increases and dissipates electromagnetic radiation. Another disadvantage of the materials disclosed in the '971 and '791 patents requires the $\mu/\in$ ratio to be near 1. The composite material has a low loss factor (tan δ) as measured only by the electronic loss of the ferroelectric material of the composite material.

Accordingly, it would be advantageous to provide a composite material comprising a ferroelectric material and a ferromagnetic material having a loss factor of less than 0.5 for a predetermined frequency range greater than 1 MHz. Furthermore, it would be advantageous to provide the composite material having both the ferroelectric and ferromagnetic material optimized for the predetermined frequency range to produce such a desired result.

SUMMARY OF THE INVENTION AND ADVANTAGES

The subject invention relates to a composite material comprising a ferroelectric material and a ferromagnetic material combined in amounts sufficient for the composite material to achieve a loss factor of from 0 to about 0.5 for a predetermined frequency range greater than 1 MHz.

The composite material can be formed into a component for use in any application for storing, focusing, shaping, and/or transmitting electromagnetic radiation at a predetermined frequency range. Such components include lenses, prisms, antennas, filters, resonators, and circulators. Each component operates at different frequency ranges and therefore the composite material is optimized for the predetermined frequency range that the component is to be utilized. For example, if the component desired is a resonator operating between 100 MHz and 150 MHz, the composite material is produced to exhibit a loss factor of less than 0.5 for the frequency range between 100 MHz and 150 MHz. In order to achieve the composite material having these properties, both the ferroelectric material and ferromagnetic material losses must be less than 0.5.

Accordingly, the subject invention provides a composite material having a loss factor less than 0.5 for a predetermined frequency range. The composite material also optimizes both the dielectric and magnetic properties of the composite material to achieve the desire result.

DETAILED DESCRIPTION OF THE PREFERRED EMBODIMENT

Figure 1:
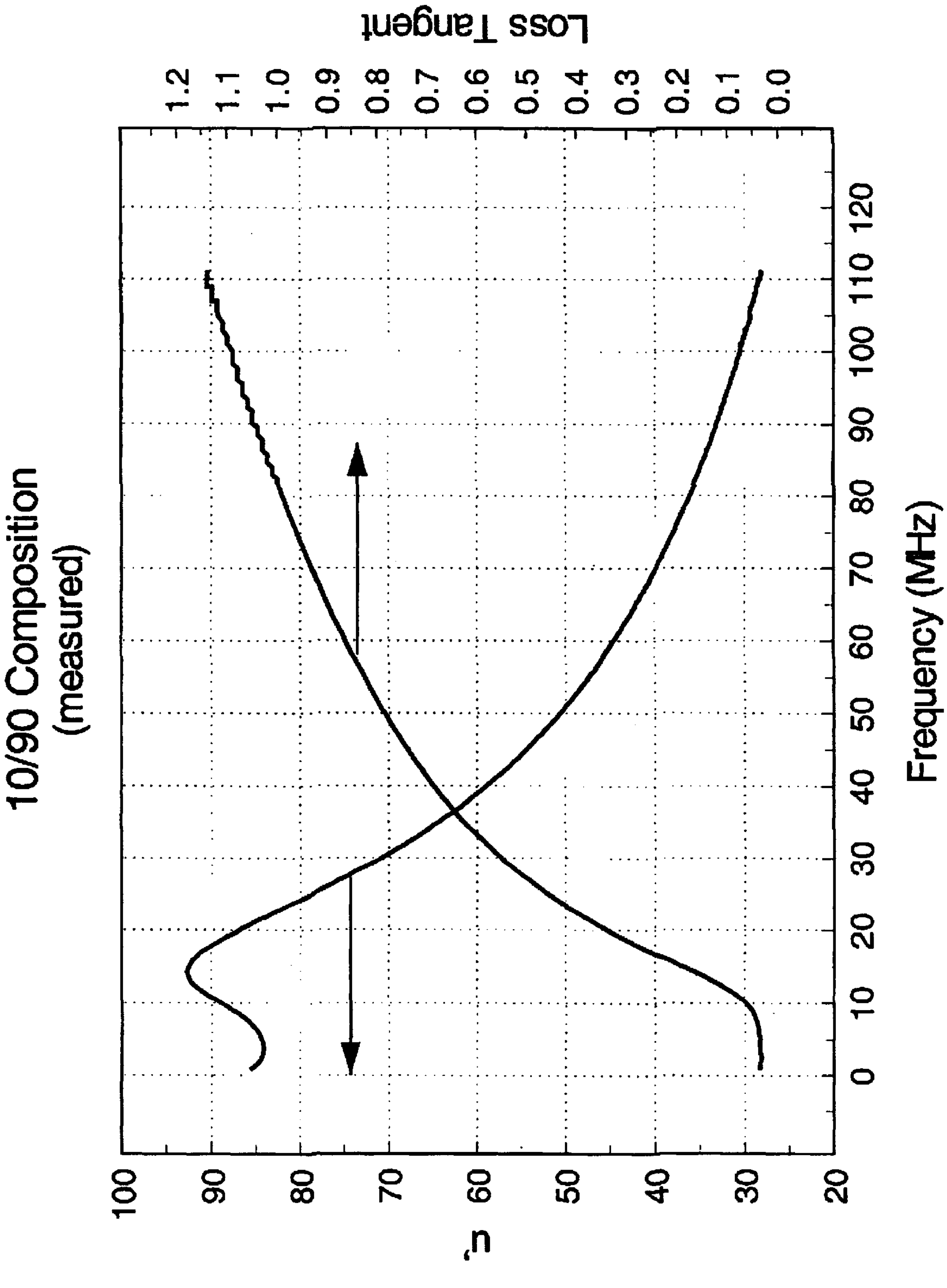
FIG. 1 is a graph showing the magnetic properties for a composite material having 90 parts ferroelectric material and 10 parts ferromagnetic material by volume based upon 100 parts by volume of the composite material.

The subject invention includes a composite material comprising a ferroelectric material and a ferromagnetic material. The composite material has both dielectric properties and magnetic properties which are attributable to both the ferroelectric material and the ferromagnetic material. The dielectric properties of each of the materials are evaluated through the measurement of the dielectric constant or permittivity ($\in$hd r) and dielectric loss factor (dielectric tan δ). The magnetic properties of each of the materials are measured at the same frequency range by measuring the relative permeability ($\mu_r$) and magnetic loss factor (magnetic tan δ).

The loss factor (tan δ) of the composite material includes the dielectric loss factor of the ferroelectric material and the magnetic loss factor of the ferromagnetic material. The loss factor may include additional losses, such as, losses due to the passage of the electromagnetic radiation through the composite material or magnetic properties of the ferroelectric and dielectric properties of the ferromagnetic. Electromagnetic radiation includes radiowaves, microwaves, infrared waves, light rays, ultraviolet rays, x-rays, and gamma rays. The loss factor is intrinsic to the composite material and serves to dissipate or absorb the incident electromagnetic radiation and therefore is most effective for these materials when the loss tangent is in the range of 1.0 or less.

The dielectric constant, permittivity $\in_r$, is related to the electromagnetic radiation storage in the material; whereas, the dielectric loss tangent is related to the power dissipation in the same material. In general, the dielectric constant is a complex quantity with $\in=\in'-i\in''$, and the dielectric loss factor is dielectric tan $\delta=\in''/\in'$. The dielectric loss factor (dielectric tan δ) usually increases with increasing dielectric constant (for ferroelectric materials), lower dielectric constant materials tend to have lower loss tangents and therefore, less insertion loss.

Permeability ($\mu_r$) is a property of materials modifying the action of magnetic poles placed therein and modifying the magnetic induction resulting when the material is subjected to a magnetic field or magnetizing force. The permeability, $\mu_r$, of a substance may be defined as the ratio of the magnetic induction in the substance to the magnetizing field to which it is subjected. The permeability of a vacuum is unity. Likewise, the magnetic loss factor is also a complex quantity with $\mu=\mu'-i\mu''$, and the magnetic loss factor is magnetic tan $\delta=\mu''/\mu'$.

As the electromagnetic radiation travels through free space, free space has an impedance, $Z_O$, defined as:

$$Z_0 = \sqrt{\frac{\mu_0}{\varepsilon_0}}$$

The impedance of free space is 377 ohms, where $\in_0$ is the permittivity of air and $\mu_0$ to is the permeability of air. The composite material has a characteristic impedance, $Z_c$, that is determined by the permittivity and the permeability of the composite material and the impedance of free space. The impedance of the composite material is defined as:

$$Z_c = Z_0\sqrt{\frac{\mu_r}{\varepsilon_r}}$$

When $Z_o=Z_c$, the characteristic impedance matches the impedance of free space and the velocity and the wavelength of the electromagnetic radiation is greatly reduced. When $Z_o$ does not equal $Z_c$, the electromagnetic radiation is reflected from the composite material. The composite materials permittivity and permeability are used to calculate the velocity and the wavelength as the electromagnetic radiation passes through the composite material. The velocity is calculated as follows:

$$v = \frac{c}{\sqrt{\mu_r\varepsilon_r}},$$

where c is the speed of light ($3\times10^8$ m/s)

The wavelength is calculated as follows, where f is the frequency of the electromagnetic radiation:

$$\lambda = \frac{c}{f\sqrt{\mu_r\varepsilon_r}}$$

Therefore, when $\in_r=\mu_r$, and both are about 100, the composite material reduces the velocity and the wavelength of the electromagnetic radiation by a factor of 100.

The subject invention combines the ferroelectric material and the ferromagnetic material in amounts sufficient for the composite material to achieve a loss factor of from 0 to about 1.0 for a predetermined frequency range greater than 1 MHz. The loss factor is further defined as from 0 to about 0.5 for the predetermined frequency range. The predetermined frequency range is preferably selected from the range of about 1 MHz to about 100 GHz. The loss factor is more preferably less than 0.25 for the predetermined frequency range.

After the predetermined frequency range has been selected, the ferroelectric material is optimized for the predetermined frequency range. The ferroelectric material has a dielectric loss factor of from 0 to about 0.5, preferably from 0 to about 0.25 for the predetermined frequency range. However, the ferroelectric material may have a dielectric loss greater than 0.5 so long as the loss factor of the composite material is less than about 1.0.

The ferroelectric material is selected from the group consiting of Perovskite compounds, lithium-niobate compounds, manganite compounds, tungsten-bronze-oxide compounds, pyrochlore compounds, layer-structure oxide compounds, barium-fluoride compounds, molybdate compounds, boracite compounds, colemanite compounds, halide compounds, antimony sulphide iodide compounds, nitrite compounds, potassium dihydrogen phosphate compounds, sulphate compounds, alum compounds, guanidinium compounds, selenite compounds, potassium cyanide compounds, triglycine sulphate compounds, Rochelle salts, and combinations thereof.

The ferroelectric material may be further defined as a metal, wherein the metal is selected from the group consisting of Ag, Ba, Bi, Ca, Cd, Co, Cr, Cs, Cu, Dy, Er, Eu, Fe, Gd, Ge, Hf, Ho, In, K, La, Li, Lu, Mg, Mn, Mo, Na, Nb, Ni, Pb, Pr, Rb, Sb, Sc, Sm, Sr, Ta, Tb, Ti, Tm, V, W, Y, Yb, Zn, Zr, and combinations thereof. Additionally, the ferroelectric material may also be defined as a metal oxide, the metal oxide having the general formula $R_{1m}O_x$, wherein m is from selected form 1 to 4 and x is a value of greater than 0 to 45. Depending upon the particular ferroelectric material selected, multiple elements may be used to form R1. For example, n may be two, so the formula would be $R_{11}R_{12}O_x$ and $R_{11}$ would be a different element than $R_{12}$. $R_{1m}$ may be selected from the group consisting of Ag, Ba, Bi, Ca, Cd, Co, Cr, Cs, Cu, D, Dy, Er, Eu, Fe, Gd, Ge, Hf, Ho, In, K, La, Li, Lu, Mg, Mn, Mo, Na, Nb, Ni, Pb, Pr, Rb, Sb, Sc, Sm, Sr, Ta, Tb, Ti, Tm, V, W, Y, Yb, Zn, Zr, and combinations thereof. It is to be appreciated that one skilled in the art would recognize that $R_{1m}$ may include a complex metal oxides wherein more than one metal forms $R_{1m}$ and the amount of oxygen is then determined from the complex metal. An example of the ferroelectric material with n being 2 includes $BaTiO_3$, wherein $R_{11}$ is Ba and $R_{12}$ is Ti.

Preferably, the ferroelectric material is further defined by the general formula, $R_{1m}O_x$, wherein m is from selected form 1 to 4 and x is a value of greater than 0 to 45. Depending upon the particular ferroelectric material selected, multiple elements may be used to form $R_1$. For example, m may be two, so the formula would be $R_{11}R_{12}O_x$ and $R_{11}$ would be a different element than $R_{12}$. $R_{1m}$ may be selected from the group consisting of Ag, Ba, Bi, Ca, Cd, Co, Cr, Cs, Cu, D, Dy, Er, Eu, Fe, Gd, Ge, Ho, In, K, La, Li, Lu, Mg, Mn, Mo, Na, Nb, Ni, Pb, Pr, Rb, Sb, Sc, Sm, Sr, Ta, Tb, Ti, Tm, V, W, Y, Yb, Zn, Zr, and combinations thereof, The ferromagnetic material is also selected such that magnetic loss factor will be optimized for the predetermined frequency range. The ferromagnetic material has a magnetic loss factor of from 0 to about 0.5, preferably from 0 to about 0.25 for the predetermined frequency range. However, the ferromagnetic material may have the magnetic loss factor greater than 0.5, so long as the loss factor for the composite material is less than about 1.0. Alternatively, the ferromagnetic material may also be selected from the group consisting of Fe femtes, Cu ferrites, Mn ferrites, Zn ferrites, Ni ferrites, and combinations thereof. It is to be appreciated that one skilled in the art would recognize that $R_{2n}$ may include a complex metal oxides wherein more than one metal forms $R_{2n}$ and the amount of oxygen is then determined from the complex metal. An example with n being 4 includes the ferroelectric material being $Cu_aNi_dZn_cFe_2O_4$, wherein wherein a, d, and e are values from greater than 0 to 1. More specifically, as illustrated in the following examples, $R_{21}$ is $Cu_{0.3}$ and $R_{22}$ is $Ni_{0.3}$ and $R_{23}$ is $Zn_{0.5}$ and $R_{24}$ is $Fe_2$.

Once the ferroelectric material and the ferromagnetic material have been optimized, both materials are combined in amounts sufficient to produce the desired overall loss factor for the predetermined frequency range. The ferroelectric material is present in an amount from 10 to 90 parts by volume based on 100 parts by volume of the composite material. The ferromagnetic material is present in an amount from 10 to 90 parts by volume based upon 100 parts by volume of the composite material such that the amount of the ferroelectric material and the ferromagnetic material equals 100 parts by volume.

The composite material may be formed from any of the following processing methods: ball milling, mixing, and sintering; hot pressing; tape casting; or laser sintering. According to the subject invention, the composite material is prepared from the ferroelectric and ferromagnetic materials which, when combined, contribute properties to the composite material, which are similar to those of the constituent materials. To achieve this aspect, the individual materials must minimally react with one another in order to preserve their distinct crystalline phases because significant interaction would diminish the desired electrical and magnetic properties, which occurs for all known composites formed for numerous other applications. It is understood by those skilled in the art that the ferroelectric material may be added in different methods to achieve different results. For instance, the ferroelectric material may be added in "globs" and the resulting composite material will achieve different dielectric and magnetic properties than a composite material having the ferroelectric material evenly dispersed.

Widely separated sintering temperatures also help to preserve the material separation and thus reduces the likelihood of an interaction between the ferroelectric and ferromagnetic materials. As such, the processing employed to form the composite material must begin with suitably sized ferroelectric and ferromagnetic particles. More specifically, the particles must be sufficiently sized so as to maintain their respective ferromagnetic and ferroelectric properties. Generally, the minimum particle diameter can be calculated according to the equation $(Dt)^{1/2}$, where D is the diffusion rate of intermixing the two materials, and t is the time which the particles will be sintered. Additionally, the mean particle size is preferably less than the desired wavelength of the electromagnetic radiation as it passes through the composite material. In addition, it is preferable that the selected ferroelectric and ferromagnetic materials have melting temperatures that differ significantly.

An additional factor in maintaining suitably high permittivity and permeability of the composite material is the porosity of the composite. In particular, porosity has been shown to be extremely deleterious to the electrical properties of both ferroelectric and ferromagnetic materials, even at levels as low as 5 volume percent. Furthermore, porosity is known to contribute other detrimental effects to the composite material, for example, low yield strength. The effect on manufacturing processes is to lower the yield in production, thereby increasing the average cost per unit. Accordingly, the processing employed to form the composite material should also minimize the formation of porosity therein. The composite material of the subject invention has a closed pore porosity from 0 to about 10 percent, preferably from 0 to about 3 percent and most preferably from about 0 to less than 1 percent by volume of the composite or any percentage within these ranges. The term "closed pore porosity" as used herein means pores are not open to the outer surface of the sintered parts and/or the pores are closed so that no air or water can flow through the pores of the sintered part.

As another aspect, the ferroelectric and ferromagnetic materials are combined and consolidated to form the composite material in a manner that ensures that the microstructure of the solid composite material is characterized by relatively large grains for both the ferroelectric and ferromagnetic materials. As such, chemical interaction between the ferroelectric and ferromagnetic materials is substantially absent to permit the materials to remain discrete particles within the composite material, so as to retain their respective permittivity and permeability properties. This result is highly unexpected, in that some chemical reaction between the ferroelectric and ferromagnetic materials would be expected. However, substantially no detrimental interaction was discovered by x-ray diffraction.

The relative quantities of the materials can be chosen to effect the final properties of the composite material and can vary widely, though the final ferroelectric and ferromagnetic properties will be effected by the geometry of the composite material. In addition, the processing used serves to minimize porosity in the composite material so as to maximize the effective permittivity and permeability of the composite while also optimizing its strength and toughness to resist chipping and cracking. Shaping of the composite material can be done using routine procedures well known for ceramic materials.

The shaping of the composite material includes altering the thickness of the composite material component. However, altering the thickness does not change the index of refraction of the composite material, but does alter the optical path length. The index of refraction is used to shrink the wavelength which is a function of the $\in_r$ and $\mu_r$ of the final composite material. If the desire result is to shrink the electromagnetic radiation by 200%, both the $\in_r$ and $\mu_r$ of the composite material will be about 200. As the $\in_r$ and $\mu_r$ are increased, the amount of reduction of the electromagnetic radiation increases.

The composite material of the subject invention has a permeability to a permittivity ratio ($\mu/\in$) of about 0.5 to about 5, preferably about 0.5 to about 2, and more preferably about 0.8 to about 1.3 for the predetermined frequency range. However, the $\mu/\in$ ratio may vary from these ranges and be accounted for in the shaping of the composite material, as discussed above. For instance, the composite material may have a $\mu/\in$ ratio of 2.5 and after shaping the composite material produces a loss factor less than 0.5 for the predetermined frequency range, which accomplishes the subject invention.

The subject invention further includes a method of producing a composite material. The method comprises the steps of selecting a frequency range that is within a range of frequencies of greater than 1 MHz, selecting a ferroelectric material having a dielectric loss factor less than 0.5 for the frequency range. In selecting the ferroelectric material, the ferroelectric material has a dielectric loss factor for the frequency range. The dielectric loss factor is compared a first threshold value being less than 0.5. Next, the ferromagnetic material is selected having a magnetic loss factor less than 0.5 for the frequency range. In selecting the ferromagnetic material, the ferromagnetic material has a magnetic loss factor for the frequency range. The magentic loss factor is compared a second threshold value being less than 0.5. More preferably. the first and second threshold value is from 0 to 0.25 for the frequency range.

Once both materials have been selected, the materials are combined in amounts sufficient to produce the composite material having a loss factor from 0 to about 1.0 for the predetermined frequency range wherein the loss factor includes the dielectric loss factor and the magnetic loss factor. Furthermore, the materials are optimized such that loss factor of the composite material is less than 1.0.

The step of combining the ferroelectric material with the ferromagnetic material further comprises the step of combining the ferroelectric material in an amount from 10 to 90 parts by volume based on 100 parts by volume of the composite material and the ferromagnetic material in an amount from 10 to 90 parts by volume based on 100 parts by volume of the composite material such that the amount of the ferroelectric material and the ferromagnetic material equals 100 parts by volume.

The step of selecting the ferroelectric material is further defined by the step of selecting the ferroelectric material having the general formula, $R_{1m}O_x$, wherein m is from selected form 1 to 4 and x is a value of greater than 0 to 45. Depending upon the particular ferroelectric material selected, multiple elements may be used to form $R_1$. For example, m may be two, so the formula would be $R_{11}R_{12}O_x$ and $R_{11}$ would be a different element than $R_{12}$. $R_{1m}$ is selected from the group consisting of Ag, Ba, Bi, Ca, Cd, Co, Cr, Cs, Cu, D, Dy, Er, Eu, Fe, Gd, Ge, Hf, Ho, In, K, La, Li, Lu, Mg, Mn, Mo, Na, Nb, Ni, Pb, Pr, Rb, Sb, Sc, Sm, Sr, Ta, Tb, Ti, Tm, V, W, Y, Yb, Zn, Zr, and combinations thereof, The step of selecting the ferromagnetic material is further defined by selecting the ferromagnetic material having the general formula, $R_{2n}O_y$, wherein n is from selected form 1 to 6 and y is a value of greater than 0 to 45. Depending upon the particular ferromagnetic material selected, multiple elements may be used to form $R_2$. For example, n may be two, so the formula would be $R_{21}R_{22}O_y$ and $R_{21}$ would be a different element than $R_{22}$. $R_{2n}$ is selected from the group consisting of Al, Ba, Ca, Cd, Ce, Co, Cu, Cr, Cs, Dy, Er, Eu, Fe, Gd, Hf, Ho, Jr, K, La, Li, Mg, Mn, Mo, Na, Nd, Ni, Pd, Pr, Pt, Rb, Re, Rh, Ru, Sc, Sm, Sr, Ta, Tb, Ti, Tm, V, W, Y, Yp, Zn, Zr, and combinations thereof.

The step of selecting the ferroelectric material and the step of selecting the ferromagnetic material further comprises the step of selecting the ferroelectric material and the ferromagnetic material such the composite material has a permeability to a permittivity ratio of about 0.5 to about 5 for the predetermined frequency range.

EXAMPLE 1

Figure 2:
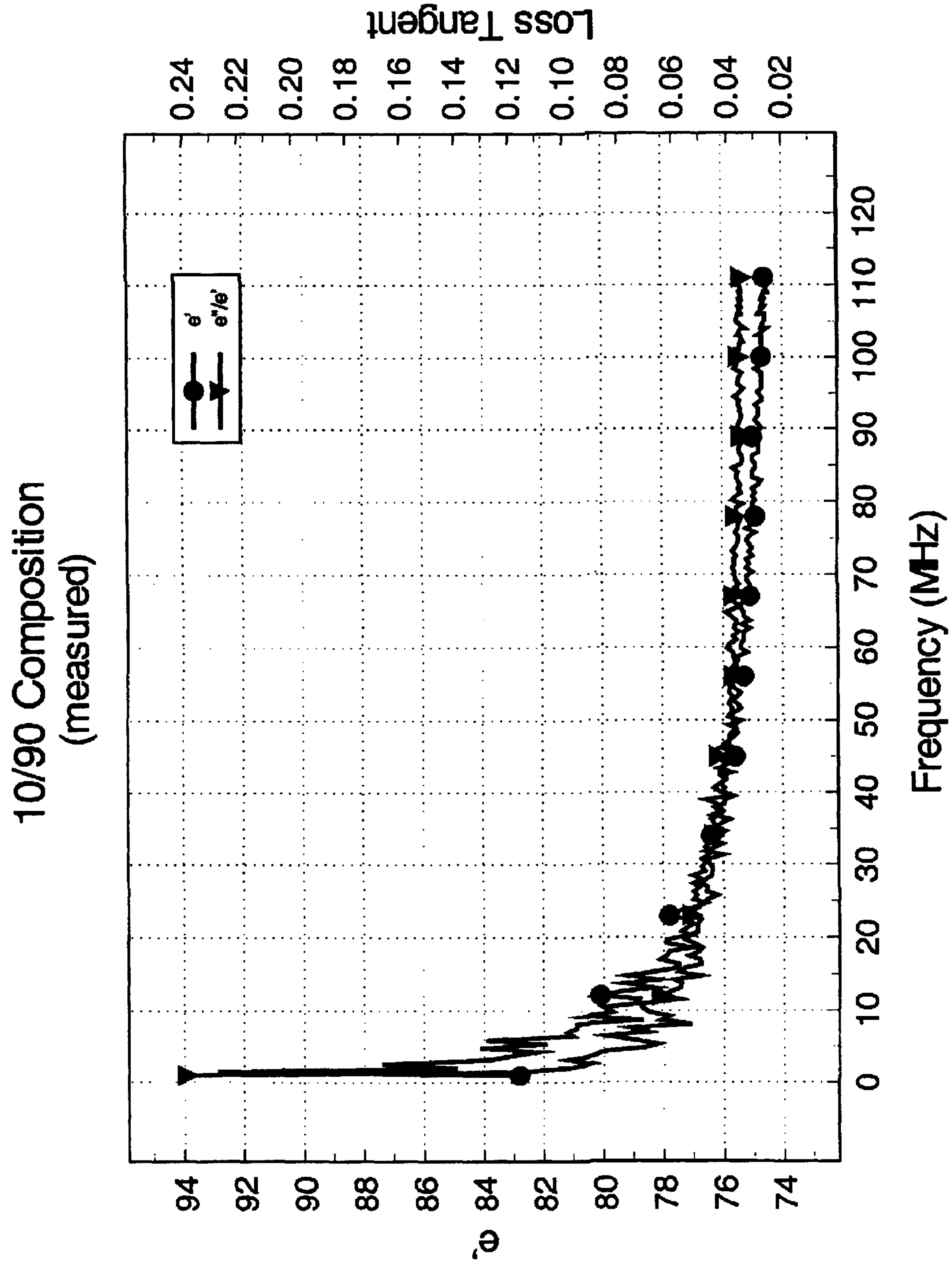
FIG. 2 is a graph showing the dielectric properties for the composite material of FIG. 1.
Figure 3:
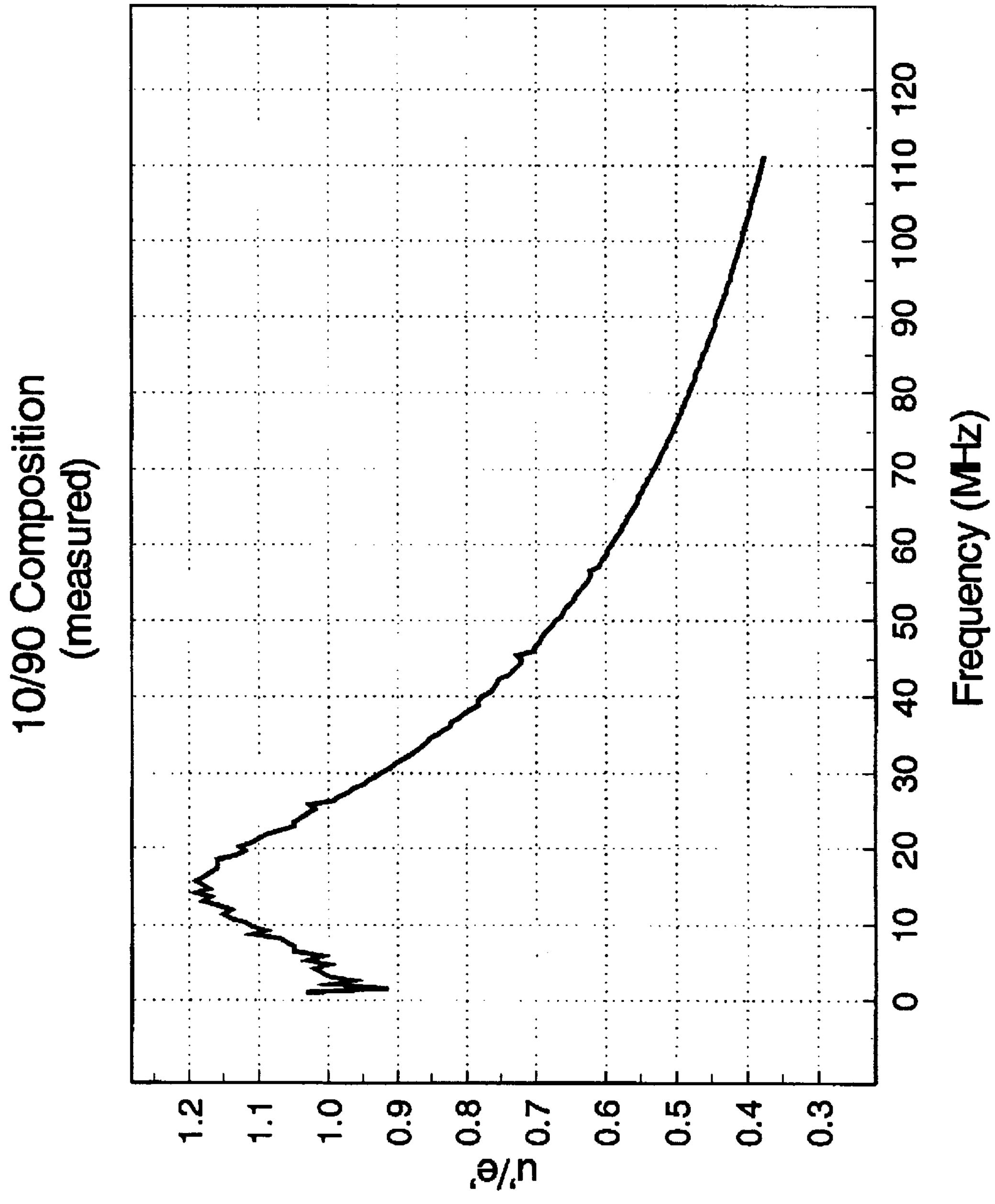
FIG. 3 is a graph showing a permeability to permittivity ratio for the composite material of FIG. 1.

A powder mixture consisting of 10% by volume $BaTiO_3$ powder and 90% by Volume of $Cu_{0.3}Ni_{0.3}Zn_{0.5}Fe_2O_4$ was ball milled for six hours in a polyethylene-lined mill utilizing water and stainless steel ball media. Equal volumes of the $BaTiO_3$, density—6.0 g/cc, and $Cu_{0.3}Ni_{0.3}Zn_{0.5}Fe_2O_4$ density—5.1 g/cc were prepared by weighing. The milling was continued for six hours and the milled powder removed and dried and then sieved with a 40 mesh screen. The material volume percentages were selected to optimize the material for the predetermined frequency range being between 20 MHz and 75 MHz. FIGS. 1 through 3 show the properties of the material for the predetermined frequency range.

The resulting powder had a specific surface area (BET method) of 4.0 $m^2/g$. A suitable specific area has a value in the range of 1.5 to 5 $m^2/g$. The milled and dried powder was then isostatically compacted into a small cylindrical pellet of dimensions 9 mm diameter and 12 mm long at a pressure of 30,000 psi. The compact was fired at a temperature of 1100° C.

Specifically, as shown in FIG. 1, the composite material has a permeability, $\mu$, and magnetic loss tangent as listed in Table 1 below.

TABLE 1

Magnetic Properties of the composite material

| Frequency (MHz) | Permeability | Magnetic Loss Tangent |
|---|---|---|
| 20 | 87.5 | 0.33 |
| 30 | 71.0 | 0.55 |
| 40 | 58.0 | 0.70 |
| 50 | 51.0 | 0.80 |
| 60 | 45.0 | 0.85 |
| 70 | 40.0 | 0.91 |
| 75 | 37.0 | 0.95 |

FIG. 2 shows the dielectric constant, or permittivity $\in$, and the dielectric loss tangent for the predetermined frequency range is shown in Table 2 below.

TABLE 2

Dielectric Properties of the composite material

| Frequency | Permittivity | Dielectric Loss Tangent |
|---|---|---|
| 20 | 77.5 | 0.060 |
| 30 | 76.5 | 0.040 |
| 40 | 76.0 | 0.041 |
| 50 | 75.5 | 0.039 |
| 60 | 75.4 | 0.040 |
| 70 | 75.1 | 0.039 |
| 75 | 75.2 | 0.037 |

FIG. 3 shows the permeability to permittivity ratio for the composite material for the predetermined frequency range and is listed in Table 3. Table 3 also includes the total loss factor for the composite material which includes both the magnetic loss and the dielectric loss.

TABLE 3

$\mu/\epsilon$ Ratio of the composite material

| Frequency | $\mu/\epsilon$ Ratio | Total Loss Factor |
|---|---|---|
| 20 | 1.11 | 0.390 |
| 30 | 0.92 | 0.590 |
| 40 | 0.78 | 0.741 |
| 50 | 0.68 | 0.839 |
| 60 | 0.59 | 0.890 |

TABLE 3-continued

| $\mu/\epsilon$ Ratio of the composite material | | |
|---|---|---|
| Frequency | $\mu/\epsilon$ Ratio | Total Loss Factor |
| 70 | 0.55 | 0.949 |
| 75 | 0.51 | 0.987 |

Obviously, many modifications and variations of the present invention are possible in light of the above teachings. The invention may be practiced otherwise than as specifically described within the scope of the appended claims.

What is claimed is:

1. A composite material comprising:

a ferroelectric material and a ferromagnetic material combined in amounts sufficient for the composite material to achieve a loss factor of form 0 to 0.5 for ar or from 0 to about 0.5 for a frequency range with a range of frequencies of greater then 1 MHz and having a premeability to a permittivity ratio ($\mu/\in$) of about 0.5 to about 5 fur the frequency range.

2. A composite material as set forth in claim 1 wherein said loss factor includes a dielectric loss factor of said ferroeleciric material and a magnetic loss factor of said ferromagnetic material.

3. A composite material as Set forth in claim 2 wherein said ferroelectric material has a dielectric loss factor of from 0 to less than about 0.5 for the frequency range.

4. A composite material as set forth in claim 3 wherein said ferromagnetic material has a magnetic loss factor of from 0 to less than about 0.5 for the frequency range.

5. A composite material as set forth in claim 1 wherein said ferroelectric material is present in an amount from 10 to 90 parts by volume based on 100 parts by volume of the composite material and said ferromagnetic material is present in an amount from 10 to 90 parts by volume based upon 100 parts by volume of the composite material such that the amount of said ferroelectric material and said ferromagnetic maternal equals 100 parts by volume.

6. A composite material as set forth in claim 1 wherein said ferroelectric material is selected from the group consisting of perovskite compounds, lithium-niobate compounds, manganite compounds, tungsten-bronze oxide compounds, pyrochiore compounds, layer-structure oxide compounds, baziuin-fluocide compounds, molybdate compounds, horacite compounds, colemanite compounds, halide compounds, antimony sulphide iodide compounds, ninite compounds, nitrate compounds, potassium dihydrogen phosphate compounds, sulphate compounds, alum compounds, guanidinium compounds, selenile compounds, potassium cyanide compounds, triglycine sulphate compounds, Rochelle salts, and combinations thereof.

7. A composite material as set forth in claim 1 wherein said ferroelectric material is defined as a metal, wherein said metal is selected from the group consisting of Ag, Ba, Bi, Ca, Cd, Co, Cr, Cs, Cu, Dy, Er, Eu, Fe, Gd, Ge, Hf, Ho, In, K, La, Li, Lu, Mg, Mn, Mo, Na, Nb, Ni, Pb, Pr, Rb, Sb, Sc, Sm, Sr, Ta, Tb, Ti, Tm, V, W, Y, Yb, Zn, Zr, and combinations thereof.

8. A composite material as set forth in claim 1 wherein said ferroelectric material is defined as a metal oxide, said metal oxide having the general formula $R_{1m}O_x$, wherein m is a value from 1 to 4 and x is a value of from greater than 0 to 45, and wherein $R_{1m}$ is selected from the group consisting of Ag, Ba, Bi, Ca, Cd, Co, Cr, Cs, Cu, Dy, Er, Eu, Fe, Gd, Ge, Hf, Ho, In, K, La, Li, Lu, Mg, Mn, Mo, Na, Nb, Ni, Pb, Pr, Rb, Sb, Sc, Sm, Sr, Ta, Tb, Ti, Tm, V, W, Y, Yb, Zn, Zr, and combinations thereof.

9. A composite material as set forth in claim 1 wherein said farromagnetic material further defined by the general formula, $R_{2n}O_y$, wherein n is a value from 1 to 6 and y is a value of from greater than 0 to 45, and wherein $R_{2n}$ is selected from the group consisting of Al, Ba, Ca, Cb, Ce, Co, Cu, Cr, Cs, Dy, Er, Eu, Fe, Gd, Hf, Ho, Ir, K, La, Li, Mg, Mn, Mo, Na, Nd, Ni, Os, Pd, Pr, Pt, Rb, Re, Rh, Ru, Sc, Sm, Sr, Ta, Tb, Ti, Tm, V, W, Y, Yp, Zn, Zr, and combinations thereof.

10. A composite material as set forth in claim 1 wherein said ferromagnetic material is selected from the group consisting of Fe ferrites, Cu ferrites, Mn ferrites, Zn ferrites, Ni ferrites, and combinations thereof.

11. A composite material a set forth in claim 1 wherein said ferroelectric material is further defined as $BaTiO_3$ and said ferromagnetic material is further defined as $Cu_aNi_dZn_eFe_2O_4$ wherein a, d, and e are values from greater than 0to 1.

12. A composite material as set forth in claim 1 wherein said permeability to permittivity ratio ($\mu/\in$) is further defined as about 0.5 to about 2 for the frequency range.

13. A composite material as set forth in clan 1 wherein said permeability to permittivity ratio ($\mu/\in$) is further defined as about 0.8 to about 1.3 for the frequency range.

14. A composite material set forth in claim 1 wherein said frequency range is within the range of about 1 MHz to about 100 Hz.

15. A composite material as set forth in claim 14 wherein said loss factor is than 0.25 for said frequency range.

16. A composite material as set forth in claim 14 wherein said loss factor is less than 0.1 for said frequency range.

17. A method of producing a composite material, said method comprising the steps of:

selecting a frequency range within a range of frequencies of greater than 1 MHz;

comparing a dielectric loss factor of a ferroclectric material for the frequency range to a first threshold value;

comparing a magnetic loss factor of ferromagnetic material for the frequency range to a second threshold value;

combining the ferroelectric material with the ferromagnetic material in amounts sufficient to produce the composite material having a loss factor from 0 to about 1.0 for the frequency range wherein the loss factor includes the dielectric loss factor and the magnetic loss factor.

18. A method as set forth in claim 17 including the step of selecting the ferroelectric material and selecting the ferromagnetic material to produce a combined loss factor based upon the dielectric loss factor and the magnetic loss factor of the composite material from 0 to about 0.5 for the frequency range.

19. A method as set forth in claim 18 wherein the step of selecting the ferroelectric material and the step of selecting the ferromagnetic material further comprises the step at selecting the ferroelectric material and the ferromagnetic material having the combined loss factor for the composite material from 0 to about 0.25 for the frequency range.

20. A method as set forth in claim 17 wherein the step of combining the ferroelectric material with the ferromagnetic material further comprises the step of combining the ferroelectric material in an amount from 10 to 90 parts by volume based on 100 parts by volume of the composite material and the ferromagnetic material in an amount from 10 to 90 parts by volume based on 100 parts by volume of the composite material such that the amount of the ferroelectric material and the ferromagnetic material equals 100 parts by volume.

21. A method as set forth in claim 17 wherein the step of comparing the fermelectric material is further defined by step of comparing dielectric properties of the ferroelectric material having the general formula, $R_{1m}O_x$, wherein n is a value from 1 to 4 and x is a value of from greater than 0 to 45, and wherein $R_{1m}$ is selected from the group consisting of Ag, Ba, Bi, Ca, Cd, Co, Cr, Cs, Cu, Dy, Er, Eu, Fe, Gd, Ge, IIf, IIo, In, K, La, Li, Lu, Mg, Mn, Mo, Na, Nb, Ni, Pb, Pr, Rb, Sb, Sc, Sm, Sr, Ta, Tb, Ti, Tm, V, W, Y, Yb, Zn, Zr, and combination thereof.

22. A method as set forth in claim 17 wherein the step of comparing the ferromagnetic material is further defined by comparing magnetic properties of the ferromagnetic material having the general formula, $R_{2n}O_y$, wherein n is a value from 1 to 6 and y is a value of from greater than 0 to 45, and wherein $R_{2n}$ is selected from the group consisting of Al, Ba, Ca, Cb, Ce, Co, Cu, Cr, Cs, Dy, Er, En, Fe, Gd, Hf, Ho, In, K, La, Li, Mg, Mn, Mo, Na, Nd, Ni, Os, Pd, Pr, Pt, Rb, Re, Rh, Ru, Sc, Sm, Sr, Ta, Tb, Ti, Tm, V, W, Y, Yp, Zn, Zr, and combinations thereof.

23. A method as set forth in claim 18 wherein the step of selecting the ferroelectric material and the step of selecting the ferromagnetic material further comprises the step of selecting the ferroelectric material having a permittivity and selecting the ferromagnetic material having a permeability such the composite material has a permeability to permittivity ratio ($\mu/\in$) of about 0.5 to about 5 for the frequency range.

24. A method as set forth in claim 17 wherein the step of selecting the frequency range is further defined by selecting the frequency range from within the range of about 1 MHz to about 100 GHz.

25. A method of producing a composite material, said method comprising the steps of:

selecting a frequency range within a range of frequencies of greater than 1 MHz;

selecting a ferroelectric material having a dielectric loss factor less than about 0.5 for the frequency range;

selecting a ferromagnetic material having a magnetic loss factor less than about 0.5 for the frequency range;

combining the ferroelectric material with the ferromagnetic material in amounts sufficient to produce the composite material having a loss factor below about 1.0 for the frequency range wherein the loss factor is equal to the sum of the dielectric loss factor and the magnetic loss factor.

26. A method as set forth in claim 25 wherein the step of selecting the ferroelectric material and the step of selecting the ferromagnetic material further comprises the step of selecting the ferroelectric material and the ferromagnetic material such that the loss factor for the composite material is from 0 to about 0.5 for the frequency range.

27. A method as set forth in claim 25 wherein the step of combining the ferroelectric material with the ferromagnetic material further comprises the step of combining the ferroelectric material in an amount from 10 to 90 parts by volume based on 100 parts by volume of the composite material and the ferromagnetic material in an amount from 10 to 90 parts by volume based on 100 parts by volume of the composite material such that the amount of the ferroelectric material and the ferrromagnetic material equals 100 parts by volume.

28. A method as set forth in claim 25 wherein the step of selecting the ferroelectric material is further defined by the step of selecting the ferroelectric material having the general formula, $R_{1m}O_x$, wherein m is a value from 1 to 4 and x is a value of from greater than 0 to 45, and wherein $R_{1m}$ is selected from the group consisting of Ag, Ba, Bi, Ca, Cd, Cu, Cr, Cs, Cu, Dy, Er, Eu, Fe, Gd, Ge, Hf, Ho, In, K, La, Li, Lu, Mg, Mn, Mo, Na, Nb, Ni, Pb, Pr, Rb, Sb, Sc, Sm, Sr, Ta, Tb, Ti, Tm, V, W, Y, Yb, Zn, Zr, and combinations thereof, and x is a value from greater than 0 to 45.

29. A memthod as set forth in claim 25 the step of selecting the ferromagnetic material is further defined by selecting the ferromagnetic material having the general formula, $R_{2n}$ $O_y$, wherein n is a value from 1 to 6 and y is a value of from greater than 0 to 45, and wherein $R_{2n}$ is selected from the group consisting of Al, Ba, Ca, Cb, Ce, Co, Cu, Cr, Cs, Dy, Er, Eu, Fe, Gd, Hf, Ho, Ir, K, La, Li, Mg, Mu, Mo, Na, Nd, Ni, Os, Pd, Pr, Pt, Rb, Re, Rh, Ru, Sc, Sm, Sr, Ta, Tb, Ti, Tm, V, W, Y, Yp, Zn, Zr, and combinations thereof, and y is a value from greater than 0 to 45.

30. A method as set forth in claim 25 wherein the step of selecting the ferroelectric material and the step of selecting the ferromagnetic material further comprises the step of selecting the ferroelectric material and the ferromagnetic material such the composite material has a permeability to a permnittivity ratio ($\mu/\in$) of about 0.5 to about 5 for the frequency range.

31. A method as set forth in claim 25 wherein the step of selecting the frequency range is further defined by selecting the frequency range from within the rauge of about 1 MHz to about 100 GHz.

* * * * *